//USPTO

United States Patent
Heyne et al.

(12) United States Patent
(10) Patent No.: US 11,130,416 B2
(45) Date of Patent: Sep. 28, 2021

(54) COOLING SYSTEM AND METHOD FOR COOLING A CHARGING COLUMN SYSTEM FOR CHARGING ELECTRICALLY DRIVABLE MOTOR VEHICLES

(71) Applicant: Dr. Ing. h.c. F. Porsche Aktiengesellschaft, Stuttgart (DE)

(72) Inventors: Raoul Heyne, Wiernsheim (DE); Jochen Schukraft, Untergruppenbach (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 125 days.

(21) Appl. No.: 16/773,147

(22) Filed: Jan. 27, 2020

(65) Prior Publication Data

US 2020/0238845 A1    Jul. 30, 2020

(30) Foreign Application Priority Data

Jan. 29, 2019    (DE) .......................... 102019102154.5

(51) Int. Cl.
*B60L 53/302* (2019.01)
*B60L 53/60* (2019.01)
*H05K 7/20* (2006.01)

(52) U.S. Cl.
CPC ............. *B60L 53/302* (2019.02); *B60L 53/60* (2019.02); *H05K 7/20927* (2013.01)

(58) Field of Classification Search
CPC ................................................... B60L 53/302

USPC ........................................................ 320/119
See application file for complete search history.

(56) References Cited

U.S. PATENT DOCUMENTS

| | | | |
|---|---|---|---|
| 5,341,083 A * | 8/1994 | Klontz ................... | B60L 53/38 320/109 |
| 2015/0054460 A1* | 2/2015 | Epstein ................... | B60L 58/26 320/109 |
| 2019/0337406 A1* | 11/2019 | Mingenbach ......... | B60L 53/302 |

FOREIGN PATENT DOCUMENTS

DE    2224740 A1    11/1973

* cited by examiner

Primary Examiner — Jerry D Robbins
(74) Attorney, Agent, or Firm — RatnerPrestia

(57) ABSTRACT

A cooling system for a charging column system for charging electrically driveable motor vehicles, has an inlet collecting line for the supply of a cooling medium, an outlet collecting line for the discharge of the heated cooling medium, and multiple cooling lines which are each able to be thermally coupled to an associated charging column to be cooled that serves for charging the electrically driveable motor vehicle and which serve for cooling the charging column, in particular a charging cable of a charging point and/or power electronics of the charging column. The cooling lines are fluidically connected to the inlet collecting line and to the outlet collecting line so as to be connected in parallel with respect to one another. The connection in parallel of the charging columns for the cooling allows an equal cooling power to be set for each charging column to be cooled.

12 Claims, 1 Drawing Sheet

COOLING SYSTEM AND METHOD FOR COOLING A CHARGING COLUMN SYSTEM FOR CHARGING ELECTRICALLY DRIVABLE MOTOR VEHICLES

CROSS-REFERENCE TO RELATED APPLICATION

This application claims priority to German Patent Application No. 10 2019 102 154.5, filed Jan. 29, 2019, the content of such application being incorporated by reference herein in its entirety.

FIELD OF THE INVENTION

The invention relates to a cooling system and to a method, with the aid of which a charging cooling system provided for charging electrically driveable motor vehicles is able to be cooled.

BACKGROUND OF THE INVENTION

It is known from DE 2 224 740 A1, which is incorporated by reference herein, to cool different winding spaces of a high-rating transformer via cooling lines of a cooling circuit that are connected in parallel, wherein each cooling line, connected between an inlet collecting line and an outlet collecting line, has an adjustable flow throttle. There is a constant need to improve the service life of a charging column system.

SUMMARY OF THE INVENTION

According to aspects of the invention, provision is made of a cooling system for a charging column system for charging electrically driveable motor vehicles, having an inlet collecting line for the supply of a cooling medium, having an outlet collecting line for the discharge of the heated cooling medium, and having multiple cooling lines which are each able to be thermally coupled to an associated charging column to be cooled that serves for charging the electrically driveable motor vehicle and which serve for cooling the charging column, in particular a charging cable of a charging point, and/or power electronics of the charging column, wherein the cooling lines are fluidically connected to the inlet collecting line and to the outlet collecting line so as to be connected in parallel with respect to one another.

Instead of the charging columns to be cooled being connected in series in a cooling circuit of the cooling system, the charging columns to be cooled are connected in parallel therein. This avoids a situation in which charging columns which are provided in the cooling circuit downstream of other charging columns are cooled at an already elevated inlet temperature, resulting in a lower cooling power for these charging columns. Instead, it is possible for all the charging columns to be cooled at an equal inlet temperature and, aside from pressure losses over the line length, a substantially equal inlet pressure, with the result that an equal cooling power is established for the charging columns to be cooled. This ensures uniform cooling of the charging columns, with which premature failure of an individual charging column due to an insufficient cooling power is avoided. The uniform cooling allows maintenance intervals to be optimized, with the result that preservation of the functionality of the charging columns can be achieved with less maintenance effort. A configuration of the cooling system and/or the maintenance for a worst case scenario is not necessary since it is possible to minimize the risk of outliers for the service life of the charging columns.

The connection in parallel of the charging columns furthermore makes it easily possible to declare as a charging column not to be cooled charging columns which have not been used for some time and therefore do not presently need to be cooled, and to block the cooling line leading to the charging column not to be cooled. This allows the mass flow of the cooling medium provided by the cooling system to be concentrated toward those charging columns for which cooling is presently regarded as being necessary and which have been declared as charging columns to be cooled. By avoiding unnecessary cooling at the charging columns not to be cooled, an unnecessary pressure loss can be avoided and instead the cooling power at the remaining charging columns to be cooled can be increased, whereby the service lives of the charging columns can not only be made more comparable but can also be increased. The connection in parallel of the charging columns for the cooling allows an equal cooling power to be set for each charging column to be cooled, with the result that a good service life for a charging column system is made possible.

In this case, it is moreover possible for use to be made of the realization that, for example for avoiding disturbing noise emissions for the user of a charging column, it may be advantageous for units provided for the operation of the charging column to be provided spaced apart from the charging column. In this regard, it is possible for example for a transformer, a rectifier, a cooling pump for delivering the cooling medium of the cooling system and further units to be assembled in a supply box which is positioned at a distance from the charging column. This makes it possible, in particular for multiple charging columns, for provision to be made of a common cooling system having only one cooling pump, whereby the expenditure on apparatus for the overall system can be reduced. The cooling of the charging columns of the charging column system can in this way be embodied by a distributed system which, despite a possibly increased expenditure on lines, can achieve a significant reduction in costs owing to the saving on units which are otherwise to be provided multiple times, said reduction in costs being even greater with an increase in the number of the charging columns. This facilitates to a substantial extent provision of an inexpensive and adequate infrastructure for a progressive electrification of the individual local public transport.

In one possible embodiment, it may be provided that a bypass line led past the charging columns is connected to the inlet collecting line at a point of introduction, which, in the flow direction, is situated behind the points of connection of the cooling lines to the inlet collecting line, and to the outlet collecting line at a point of discharge, which, in the flow direction, is situated in front of the points of connection of the cooling lines to the outlet collecting line. The bypass line may have a regulating valve. The bypass line makes it possible for cooling medium also to be pumped in circulation if all, or too many, of the cooling lines are blocked intentionally or unintentionally, for example as a result of a defect. In this way, an excessive build-up of pressure in the inlet collecting line can be reliably avoided. It is moreover possible for the bypass line to be used for detecting malfunctions. If a pressure and/or a throughflow which are/is larger or smaller than is to be expected in the present operating situation are/is measured in the bypass line, this can indicate a fault, whereby a check can be initiated, in particular automatically.

It is provided in particular that a bypass line led past the charging columns provides a connection between the inlet collecting line and the outlet collecting line, which bypass line may be optionally equipped with a regulating valve.

Preferably, a regulating valve, in particular a balancing valve, is connected to each cooling line for the purpose of setting an equal mass flow in the cooling lines. With the aid of the regulating valve, it is possible for the throughflow to be regulated individually for each cooling line. This makes it possible, even with consideration taken of different pressure losses over the line path up to the individual cooling lines, for an equal throughflow to be set in each cooling line leading to a charging column to be cooled.

Moreover, in the case in which the charging column associated with the respective cooling line does not need to be cooled, it is possible for the cooling line to be blocked off and for the throughflow intended for the then blocked cooling line to be used for increasing the throughflow of the other cooling lines.

It is particularly preferably provided that, for hydraulic balancing, the regulating valves communicate with one another, in particular via a control device. The regulating valves may be hydraulically coupled to one another, for example via the principle of communicating tubes. However, it is also possible for the throughflow and/or the pressure in the cooling lines to be measured using measurement units and, with the aid of the measurement data obtained in this way, for the hydraulic balancing to be achieved by way of electronic communication. Different flow resistances for the different cooling lines can be easily compensated in this way, and the regulating position of the respective regulating valves can be adapted for the purpose of achieving an equal cooling power in the different cooling lines.

In particular, for each cooling line, provision is made of a throughflow meter for measuring the throughflow of the respective cooling line upstream of the associated charging column. This makes it possible to measure the throughflow upstream of the charging column before the cooling fluid enters the charging column. In particular, a throughflow meter may, if appropriate, be provided for measuring the throughflow of the bypass line. This allows precise, in particular throughflow-based, regulation of the cooling power realized in the different cooling lines. Moreover, faults can be easily detected.

Particularly preferably, for each cooling line, provision is made of a pressure meter for measuring a stagnation point pressure of the respective cooling line upstream of the associated charging column. This makes it possible to measure the stagnation point pressure upstream of the charging column before the cooling fluid enters the charging column. In particular, a pressure meter may, if appropriate, be provided for measuring the stagnation point pressure of the bypass line. This allows precise, in particular pressure-based, regulation of the cooling power realized in the different cooling lines. Moreover, faults can be easily detected.

The charging column preferably has a monitoring device which has in particular at least one temperature sensor and which serves for detecting a cooling requirement of the charging column, wherein the monitoring device is designed such that, in the case in which no cooling requirement is detected, it closes off the associated cooling line. The monitoring device can decide whether the charging column monitored by it is a charging column to be cooled or a charging column not to be cooled. If cooling of the charging column is not or is no longer required, the associated cooling line can be closed off, with the result that new cooling medium is no longer delivered to the charging column not to be cooled. The throughflow actually intended for said cooling line can in this way be divided among the other cooling lines which are thermally coupled to charging columns to be cooled, so as to increase the cooling power there.

The invention also relates to a charging column system for charging electrically driveable motor vehicles, having multiple charging columns for charging the electrically driveable motor vehicle, having a cooling system for cooling the charging columns, which cooling system may be designed and refined as described above, having a supply box which is positioned spaced apart from the charging columns, wherein the supply box has a cooling pump for delivering the cooling medium of the cooling system and/or has a heat exchanger for cooling the cooling medium of the outlet collecting line, and having a control unit for setting the throughflow of the cooling lines. This makes it possible, in particular for multiple charging columns, for provision to be made of a common cooling system having only one cooling pump, whereby the expenditure on apparatus for the overall system can be reduced. The cooling of the charging columns of the charging column system can in this way be embodied by a distributed system which, despite a possibly increased expenditure on lines, can achieve a significant reduction in costs owing to the saving on units which are otherwise to be provided multiple times. The connection in parallel of the charging columns for the cooling allows an equal cooling power to be set for each charging column to be cooled, with the result that a good service life for a charging column system is made possible.

The invention also relates to a method for cooling a charging column system for charging electrically driveable motor vehicles, in which multiple charging columns to be cooled are cooled with the aid of a cooling system, which may be designed and refined as described above, in a manner connected in parallel. The connection in parallel of the charging columns for the cooling allows an equal cooling power to be set for each charging column to be cooled, with the result that a good service life for a charging column system is made possible.

Particularly preferably, a substantially equal throughflow is set for each charging column to be cooled. In this way, the cooling power for the charging columns can be made uniform, which ensures uniform cooling of the charging columns, with which premature failure of an individual charging column due to an insufficient cooling power is avoided.

It is provided in particular that, in the case in which, in a line which is furthest away from a pressure source, a smaller actual throughflow than in the remaining cooling lines is realized, a larger target throughflow is set for the cooling lines, and/or in the case in which, in the line which is furthest away from the pressure source, a larger actual throughflow than in the remaining cooling lines is realized, a smaller target throughflow is set for the cooling lines, and/or in the case in which an actual pressure in the inlet collecting line is above a target pressure, a smaller target throughflow is set for the cooling lines. The line furthest away may be formed by the bypass line which is possibly provided, it however alternatively being possible for the line furthest away to be provided by the cooling line provided furthest away from the inlet collecting line in the flow direction. In this way, the throughflow and the cooling power in the individual cooling lines can be easily adapted to a reduction and/or an increase in the cooling medium available. In particular, the throughflow set for the respective cooling lines can be adapted automatically if a single cooling line is opened or closed. The throughflow intended for the cooling lines can be set to be equally large even in the event of a fault or unintended flow resistances.

BRIEF DESCRIPTION OF THE DRAWINGS

Below, the invention will be explained by way of example with reference to the appended drawings on the basis of preferred exemplary embodiments, wherein the features presented below may in each case individually or in combination represent an aspect of the invention. In the drawings.

DETAILED DESCRIPTION OF THE INVENTION

Figure 1:
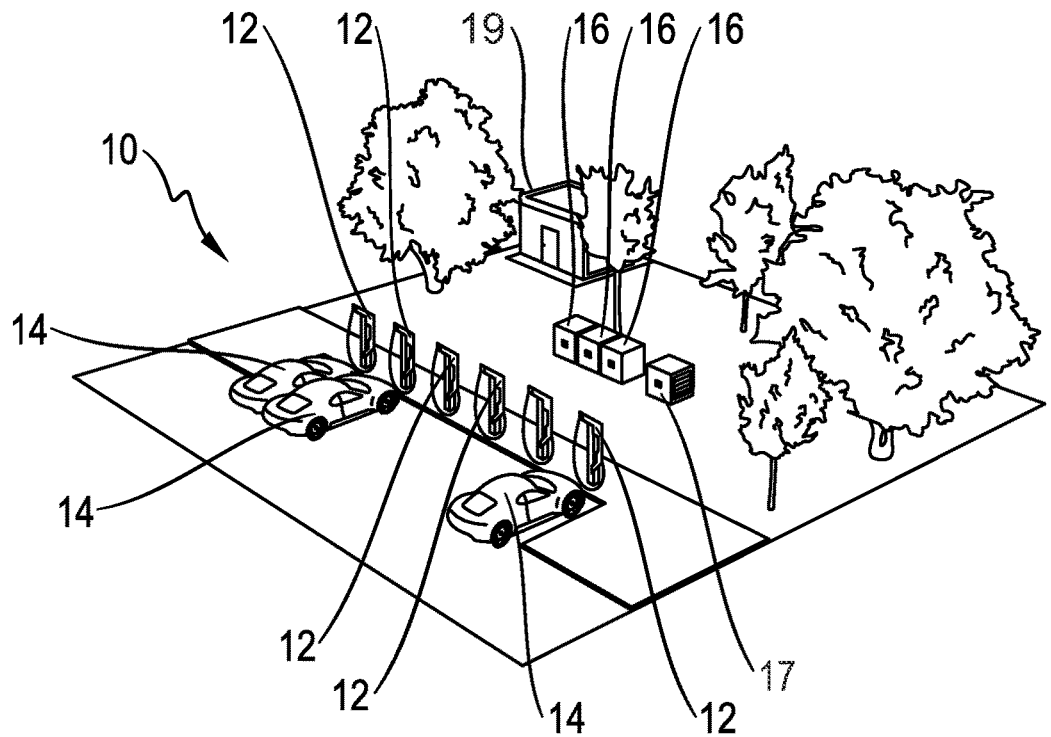
FIG. 1 shows a schematic perspective view of a charging column system.

The charging column system 10 illustrated in FIG. 1 has multiple charging columns 12, by which in each case an electrically driveable vehicle 14 can be charged. It is possible to connect to the charging columns 12 at least one, preferably exactly one, supply box 16, which has for example power electronics for the charging column 12 and possibly a transformer with rectifier for converting alternating current from an energy grid into direct current to the desired current intensity for the charging column 12. It is also possible, however, for the transformer to be provided in a separate transformer station 19. The supply box 16 and/or the cooling box 17 have/has a cooling pump 18 for cooling the charging columns 12. The supply box 16 and/or the cooling box 17 may be positioned deliberately spaced apart from the charging columns 12, for example in order that the noises generated in the supply box 16 and/or in the cooling box 17 do not disturb a user of the respective charging column 12.

Figure 2:
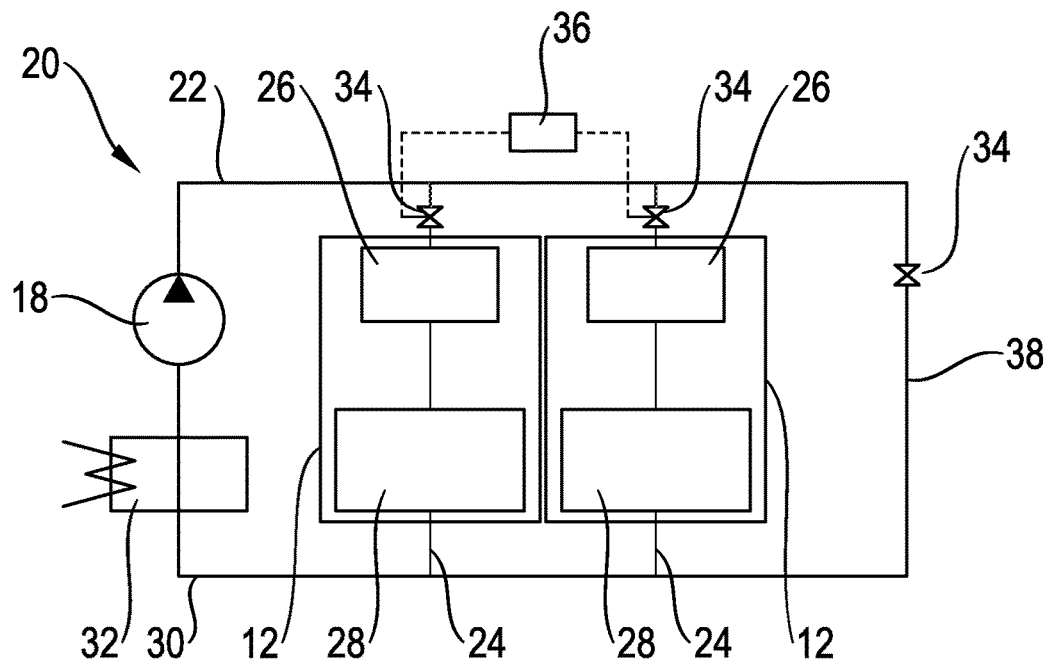
FIG. 2 shows a schematic basic illustration of a cooling system for the charging column system from FIG. 1.

The cooling system 20 illustrated in FIG. 2 has an inlet collecting line 22 into which the cooling pump 18 in the cooling box 17 pumps the cooling medium. Multiple cooling lines 24 which are connected in parallel depart from the inlet collecting line 22 in order to be able to cool the in each case associated charging column 12. The charging column 12 has for example a charging point 26 with a charging cable to be cooled, and/or has power electronics 28 to be cooled, which are thermally coupled to the associated cooling line. The cooling lines 24 are brought together in an outlet collecting line 30 and, for example via a heat exchanger 32 designed as an air cooler and serving for cooling the heated cooling medium, led back to the cooling pump 18 in the cooling box 17.

Each cooling line 24 has a regulating valve 34 which is designed as a balancing valve and which can be regulated by a control device 36 for example on the basis of a measured throughflow and/or measured pressure in the cooling line 24, in order to set an equal throughflow and/or an equal cooling power in the cooling lines 24 with charging columns 12 to be cooled. If a particular charging column 12 does not need to be cooled, it is also possible for the corresponding cooling line 24 to be shut off with the aid of the regulating valve 34 of the latter. In addition, provision is made of a bypass line 38, which is connected to the inlet collecting line 22 and to the outlet collecting line 30 and is led past the charging columns 12 and which, in the event of a fault and/or if all the cooling lines 24 are blocked off, still allows circulation of the cooling medium. Moreover, it is possible via the measurement of the throughflow and/or of the pressure in the bypass line 38 for a fault in the cooling system 20 to be detected. The bypass line 38 may likewise have a regulating valve 34 or be free of regulating valves 34.

What is claimed is:

1. A cooling system for a charging column system that is configured for charging electrically driveable motor vehicles, said cooling system comprising:
    an inlet collecting line for supplying a cooling medium,
    an outlet collecting line for discharging heated cooling medium, and
    multiple cooling lines which are each configured (i) to be thermally coupled to an associated charging column to be cooled that serves for charging an electrically driveable motor vehicle, and (ii) to serve for cooling the charging column,
    wherein the cooling lines are fluidically connected to the inlet collecting line and to the outlet collecting line so as to be connected in parallel with respect to one another.

2. The cooling system as claimed in claim 1, wherein a regulating valve in the form of a balancing valve is connected to each cooling line for the purpose of setting an equal mass flow in the cooling lines.

3. The cooling system as claimed in claim 2, wherein the regulating valves communicate with one another via a control device for hydraulic balancing.

4. The cooling system as claimed in claim 2, further comprising a throughflow meter for each cooling line, the throughflow meter being configured for measuring a throughflow of the respective cooling line upstream of the associated charging column.

5. The cooling system as claimed in claim 2, further comprising a pressure meter for each cooling line, the pressure meter being configured for measuring a stagnation point pressure of the respective cooling line upstream of the associated charging column.

6. The cooling system as claimed in claim 1, wherein the charging column has a monitoring device which has at least one temperature sensor and which serves for detecting a cooling requirement of the charging column,
    wherein the monitoring device is configured to close off the associated cooling line in a case in which no cooling requirement is detected.

7. The cooling system as claimed in claim 1, further comprising a bypass line that is led past the charging columns and provides a connection between the inlet collecting line and the outlet collecting line, which bypass line is equipped with a regulating valve.

8. The cooling system as claimed in claim 1, wherein the cooling lines serve for cooling a charging cable of a charging point, and/or power electronics of the charging column.

9. A charging column system for charging electrically driveable motor vehicles, said charging column system comprising:
    multiple charging columns for charging the electrically driveable motor vehicles,
    the cooling system as claimed in claim 1 for cooling the charging columns,
    a supply box which is spaced apart from the charging columns, wherein the supply box has a cooling pump for delivering the cooling medium of the cooling system and/or has a heat exchanger for cooling the cooling medium of the outlet collecting line, and
    a control unit for setting the throughflow of the cooling lines.

10. A method for cooling the charging column system for charging electrically driveable motor vehicles, by cooling multiple charging columns using the cooling system as claimed in claim 1 in a manner connected in parallel.

11. The method as claimed in claim 10, further comprising setting a substantially equal throughflow for each charging column to be cooled.

12. The method as claimed in claim 10, further comprising:
   (i) setting a larger target throughflow for the cooling lines in a case in which, in a line which is furthest away from a pressure source, a smaller actual throughflow than in the remaining cooling lines is realized,
   (ii) setting a smaller target throughflow for the cooling lines in a case in which, in the line which is furthest away from the pressure source, a larger actual throughflow than in the remaining cooling lines is realized, and/or
   (iii) setting a smaller target throughflow for the cooling lines in a case in which an actual pressure in the inlet collecting line is above a target pressure.

\* \* \* \* \*